(12) United States Patent
Wang et al.

(10) Patent No.: US 9,685,387 B1
(45) Date of Patent: Jun. 20, 2017

(54) TEST KEY FOR CHECKING THE WINDOW OF A DOPED REGION AND METHOD OF USING THE TEST KEY

(71) Applicant: UNITED MICROELECTRONICS CORP., Hsin-Chu (TW)

(72) Inventors: Zhe Wang, Singapore (SG); Ching Hwa Tey, Singapore (SG); Lu Zou, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/185,014

(22) Filed: Jun. 16, 2016

(51) Int. Cl.
| | |
|---|---|
| H01L 23/58 | (2006.01) |
| H01L 21/66 | (2006.01) |
| H01L 27/092 | (2006.01) |
| H01L 29/06 | (2006.01) |
| H01L 21/8238 | (2006.01) |
| G01R 31/26 | (2014.01) |
| G01R 31/28 | (2006.01) |

(52) U.S. Cl.
CPC .......... *H01L 22/34* (2013.01); *G01R 31/2644* (2013.01); *G01R 31/2884* (2013.01); *H01L 21/823878* (2013.01); *H01L 21/823892* (2013.01); *H01L 22/30* (2013.01); *H01L 27/0928* (2013.01); *H01L 29/0653* (2013.01)

(58) Field of Classification Search
None
See application file for complete search history.

(56) References Cited

U.S. PATENT DOCUMENTS

| | | | |
|---|---|---|---|
| 6,350,636 B1 | 2/2002 | Lee | |
| 2017/0069712 A1* | 3/2017 | Schustereder | .......... C23C 14/48 |

* cited by examiner

*Primary Examiner* — Jack Chen
(74) *Attorney, Agent, or Firm* — Winston Hsu

(57) ABSTRACT

A test key and a method for checking the window of a doped region using the test key are provided in the present invention. The test key includes a P-type first well region on a substrate, a P-type substrate region adjacent to the first well region, a N-type first doped region partially overlapping the first well region, two P-type second doped regions at two opposite sides of the first well region, a N-type second well region surrounding the first doped region, the substrate region and the two second doped regions, and a plurality of test pads above the above-identified region.

7 Claims, 8 Drawing Sheets

TEST KEY FOR CHECKING THE WINDOW OF A DOPED REGION AND METHOD OF USING THE TEST KEY

BACKGROUND OF THE INVENTION

1. Field of the Invention

The present invention relates to a test key arrangement, and more particularly, to a test key for checking the diffusion window and a method of using the test key.

2. Description of the Prior Art

In semiconductor fabrication, a semiconductor device or an integrated circuit (IC) should be continuously tested in every step so as to maintain device quality and to increase product yield in mass production. Normally, various types of a testing circuit, which is also referred to as "test key", are simultaneously fabricated with an actual device so that the quality of the actual device can be judged by the performance of the testing circuit or the defects in various component parts due to unexpected processing errors can be found. Once a defective component is found, causes of failure can be investigated and later rectified. The quality of the actual device therefore can be well controlled.

A typical method to test a wafer is called a wafer acceptance testing (WAT) method, which can measure defects of in a wafer. The WAT method includes providing several test keys distributed in a periphery region of a die that is desired to be tested. The test keys typically are formed on a scribe line between dies, and are electrically coupled to an external terminal through a metal pad. A module of the test keys is selected and each test key of the selected module is respectively used for a test of different property of the wafer, such as threshold voltage ($V_T$) or saturate current ($I_{DSAT}$). A controlled bias is applied to the test keys, and the induced current is read out to detect defects on the wafer.

As the semiconductor integration processes turn more and more complicated, test keys are employed more and more often as well. It is therefore important to improve the accuracy of tests.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one aspect of the embodiments, there is provided a test key for checking the window of a doped region. The test key includes a substrate, a first well region of first conductivity type on the substrate, a substrate region of first conductivity type adjacent to the first well region, a first doped region of second conductivity type partially overlapping the first well region, two second doped regions of first conductivity type at two opposite sides of the first well region, a second well region of second conductivity type surrounding the first doped region, the substrate region and the two second doped regions, and a plurality of test pads above the first doped region overlapping the first well region, the substrate region, the two second doped regions and the third well region.

In another aspect of the embodiments, there is provided a method for checking the window of a doped region by using test keys. The method includes the steps of providing an above-identified test key, performing a first electrical failure analysis test for the first doped region of second conductivity type by electrically connecting the test pad above the portion of the first well region overlapping the first doped region and the test pad above the substrate region 100a, and performing a second electrical failure analysis test for the two second doped regions of the first conductivity type by electrically connecting the test pad above the second doped regions and the test pad above the second well region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
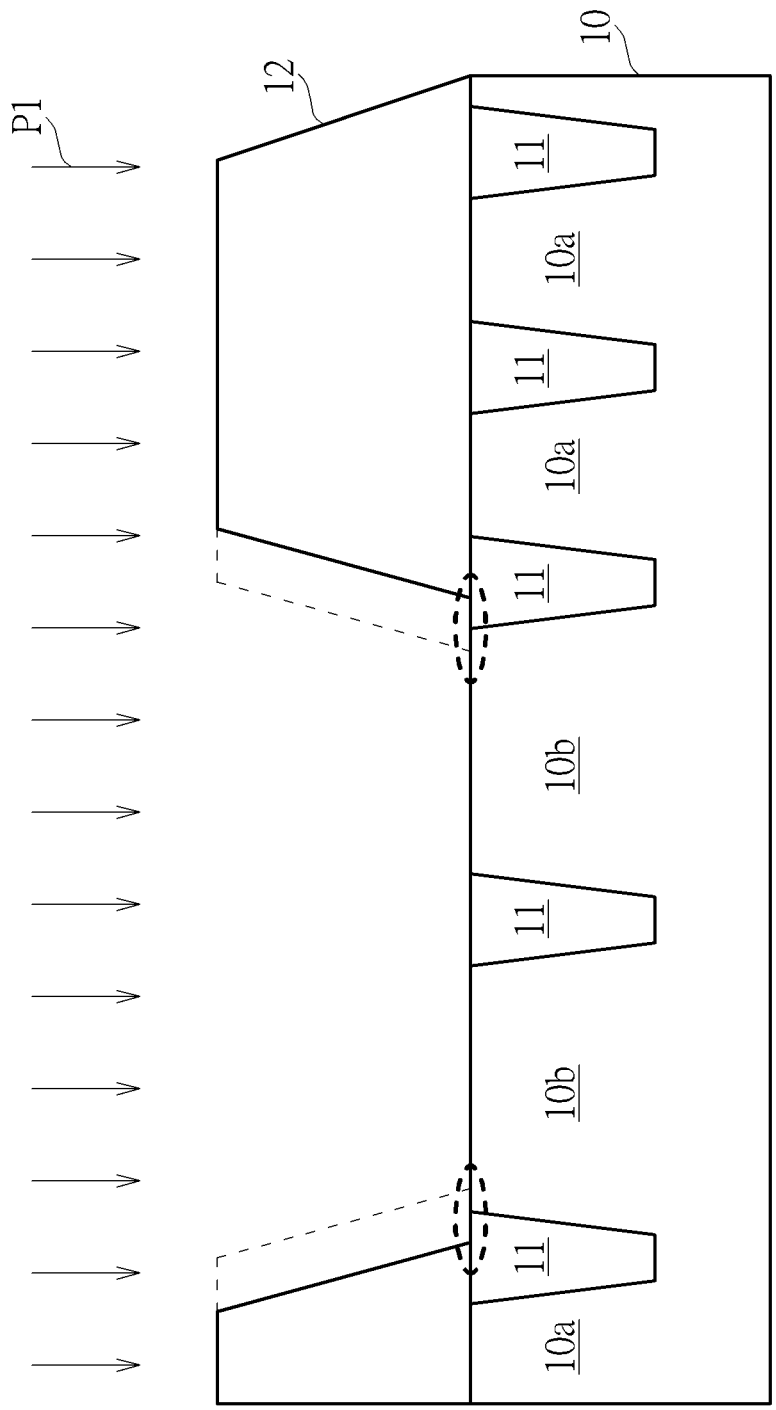
FIG. 1 is a cross-sectional view schematically illustrating a failure model of N+ partial implantation in accordance with one embodiment of the present invention.

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The test key arrangement in the present invention is specifically designed for detecting the partial implantation of a doped region via a window check. In order to provide a better understanding of the principle and purpose of the test key arrangement in the present invention for readers and those ordinarily skilled in the art, an exemplary failure model of N+ partial implantation is first provided in a cross-sectional view of FIG. 1 to illustrate the corresponding components and conditions in the implantation.

Please refer to FIG. 1, a semiconductor substrate is provided with several predetermined active areas for the devices with different conductivity types, such as NMOS and PMOS devices, isolated from each other by shallow trench isolations (STI) 11. In the embodiment, the component 10 is a P-type substrate or a P-well formed in the substrate. Active areas for PMOS 10a (referred hereinafter as PMOS AA) are covered with a photoresist 12 to block the dopants from the N+ implantation process P1. Active areas for NMOS 10b (referred hereinafter as NMOS AA) are exposed from the patterned photoresist 12 to receive the dopants. The N+ implantation P1 would form N+ doped regions in NMOS AA 10b, which may serve as the N+ source/drain of the NMOS device. In an ideal situation, the N+ implantation would be performed exactly on the NMOS AA 10b as shown in FIG. 1 without doping the undesired PMOS AA. However, the overlay shift of photoresist 12 and poor photolithographic result may make the photoresist 12 be abnormally covered on part of the NMOS AA 10b, especially at margin locations. The dashed line shows the NMOS AA 10b is partially covered by the photoresist 12 extending over the STIs 11 between the NMOS AA 10b and PMOS 10a. The abnormal photoresist coverage would cause some portions of the NMOS AA 10b not being doped by the N+ implantation P1. The partial implantation failure on NMOS AA 10b would cause the P-N junction leakage since the predetermined doped regions are changed.

In order to detect and check the window of the N+ partial implantation issue as identified above, a novel test key design is provided in the present invention with special test pads and AA arrangements of different conductivity types. Embodiments of the test keys with varied sizes for customized window check will now be described with reference to FIGS. 2 to 7, which are schematic top views illustrating the predetermined well regions, the doped regions, and the test pads in the test key arrangement. In FIGS. 2 to 7, some components are enlarged, reduced in size, or omitted for easy understanding and preventing obscuring the subject matters of the present invention.

Figure 2:
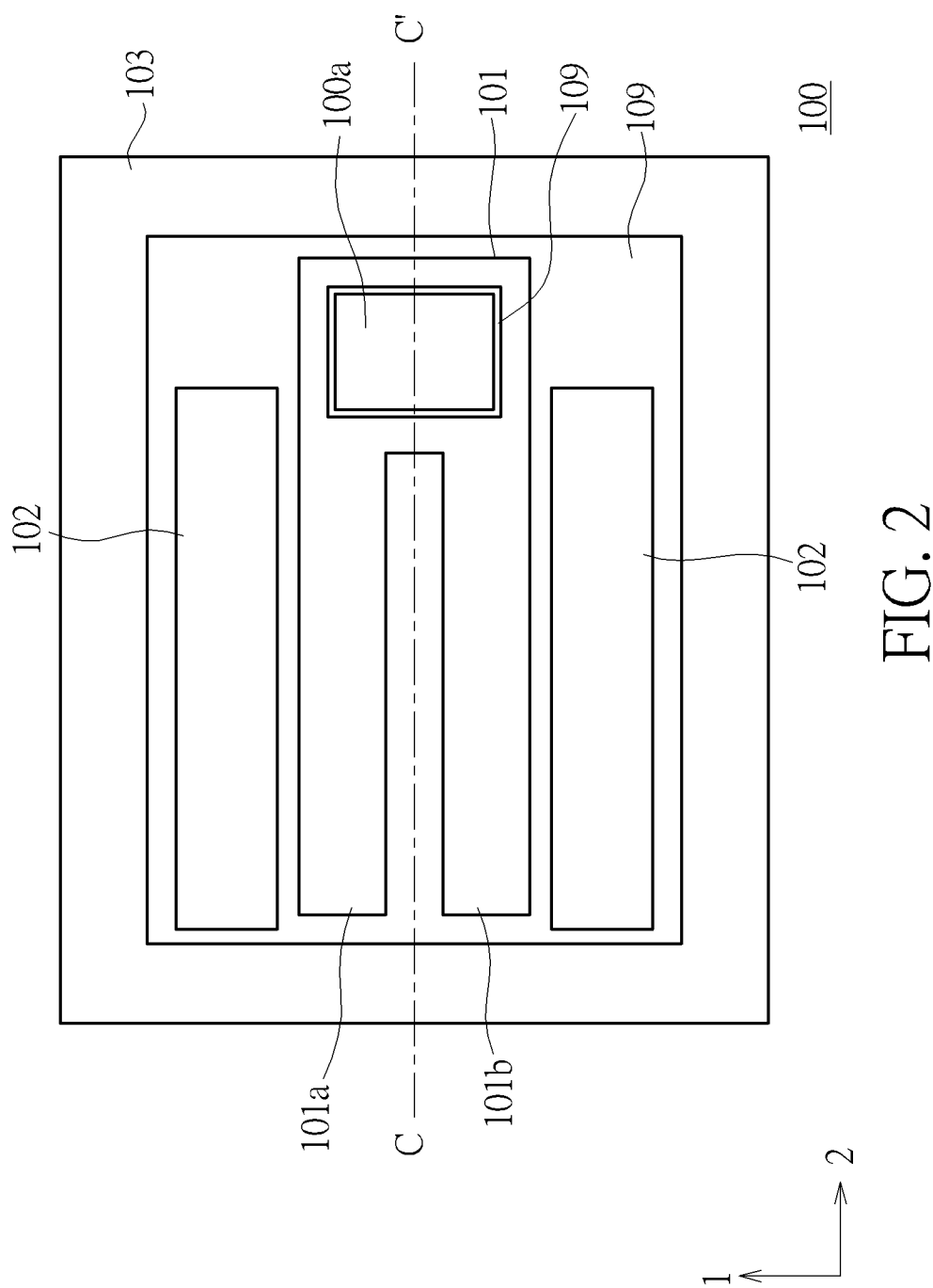
FIG. 2 is a schematic top view schematically illustrating the predetermined well regions of different conductivity types in accordance with one embodiment of the present invention.

Please refer first to FIG. 2, which is a schematic top view of the predetermined well regions of different conductivity types in accordance with one embodiment of the present invention. The arrangement starts from defining well regions for the active areas of different conductivity types. First, as shown in FIG. 2, a substrate 100 is provided to serve as the base for test keys. In the embodiment, the substrate may be exemplarily defined as a P-type substrate. In alternative embodiment, the substrate may be an N-type substrate, depending on the process requirement. Since the type of the substrate or the doped region is not exclusively limited to P-type or N-type, the terms "first conductivity type" and "second conductivity type" will be used hereinafter to indicate different doping types.

In the embodiment of FIG. 2, a first well region 101 of first conductivity type (ex. P-type) is defined on the substrate 100 with an elongated shape. The first well region 101 may be regarded as a predetermined NMOS AA 10b shown in FIG. 1. The left part of the first well region 101 is divided by a shallow trench isolation (STI) 109 into two branch portions 101a and 101b symmetric about a center line C-C' of the first well region 101 in a longitudinal direction. The arrangement of two symmetric portions in first well region 101 is designed to detect if the doped regions is shifted (either up or down) in lateral direction 1 perpendicular to the symmetric center line C-C'. The right part of the first well region 101 surrounds a substrate region 100a of first conductivity type (ex. P-type) with the STI 109 isolated therebetween.

In addition to the first well region 101 and the substrate region 100a of first conductivity type (ex. P-type) as described above, two second well region 102 of second conductivity type (ex. N-type) are respectively defined at two opposite sides of the first well region 101 with a similar elongated shape. The second well region 102 may be regarded as a predetermined PMOS AA 10a shown in FIG. 1 which is isolated from the NMOS AA 10b by STIs 11 and is covered by the photoresist 12 during the N+ implantation process. In the embodiment, the second well region 102 is an N-well formed in P-substrate 100. Further, a third well region 103 of second conductivity type (ex. N-type) is defined surrounding the first well region 101 and two second well regions 102. The predetermined first well region 101 of first conductivity type (ex. P-type), two second well regions 102 of second conductivity type (ex. N-type) and the third well region 103 of second conductivity type (ex. N-type) are isolated from each other by STI 109.

Figure 3:
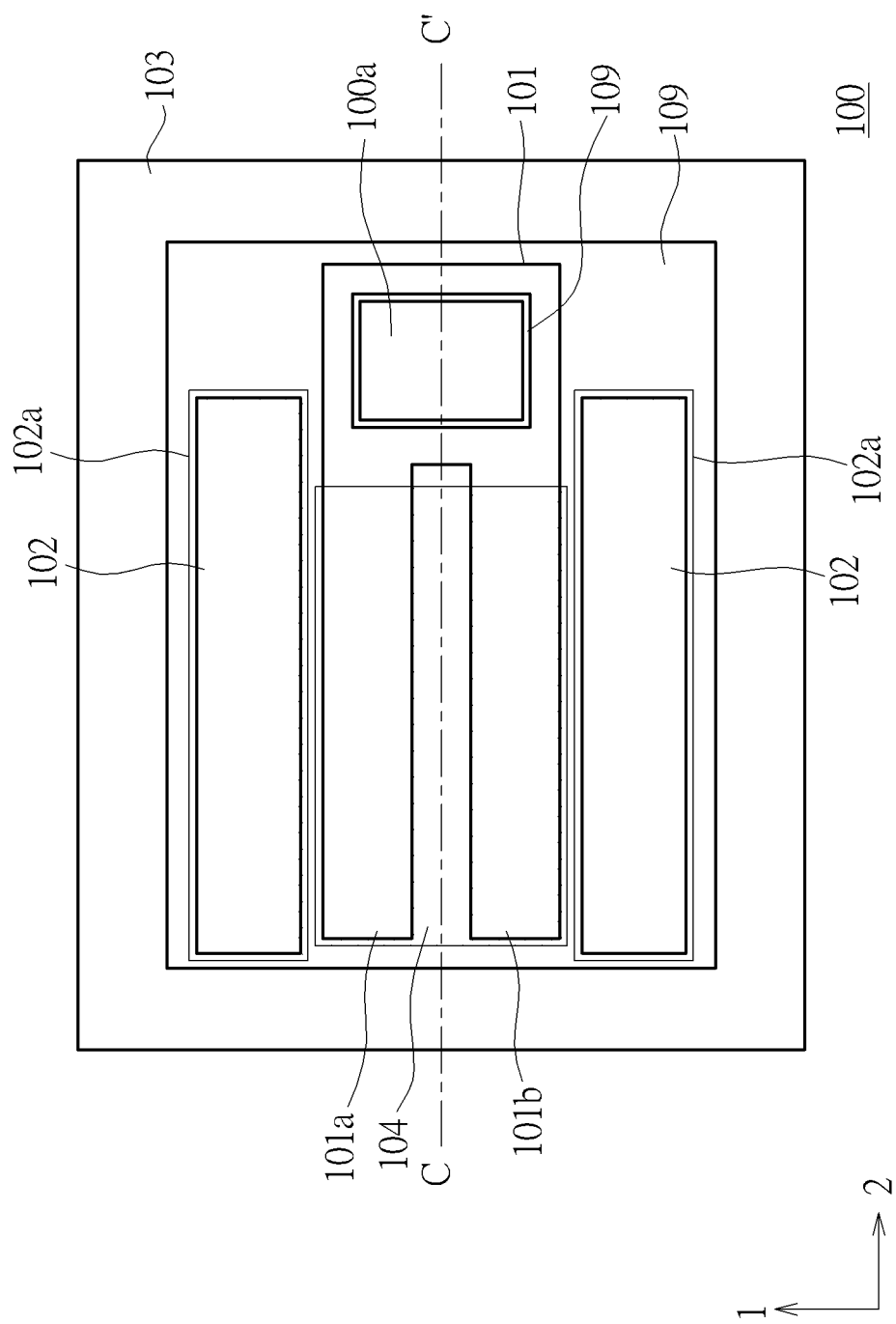
FIG. 3 is a schematic top view schematically illustrating the doped regions of different conductivity types in accordance with one embodiment of the present invention.

Please refer first to FIG. 3, which is a schematic top view schematically illustrating the doped regions of different conductivity types in accordance with one embodiment of the present invention. After the predetermined well regions of different conductivity type are defined on the substrate, a first doped region 104 (depicted as a shaded region in FIG. 3) of second conductivity type (ex. N-type) is formed partially overlapping the two branch portions 101a and 101b of the first well region 101. The first doped region 104 may be regarded as an ideal N+ implantation region as shown in FIG. 1 without any overlay shift or abnormal window size. The N+ doped regions would serve as the source/drain of the NMOS device in the embodiment. In the embodiment, the branch portions 101a and 101b of the first well region 101 is doped with N+ dopants so that its conductivity type is changed from first conductivity type (P-type) into second conductivity type (N-type).

Further, a second doped region 102a (depicted as a shaded region in FIG. 3) of first conductivity type (ex. P-type) is formed in the second well region 102. The second doped region 102a may be regarded as an ideal P+ implantation region for forming the source/drain of the PMOS device without any overlay shift or abnormal window size. In the embodiment, the whole or a part of the second well region 102 is doped with P+ dopants to form the second doped region 102a, so that its conductivity type is changed from second conductivity type (N-type) into first conductivity type (P-type).

Figure 4:
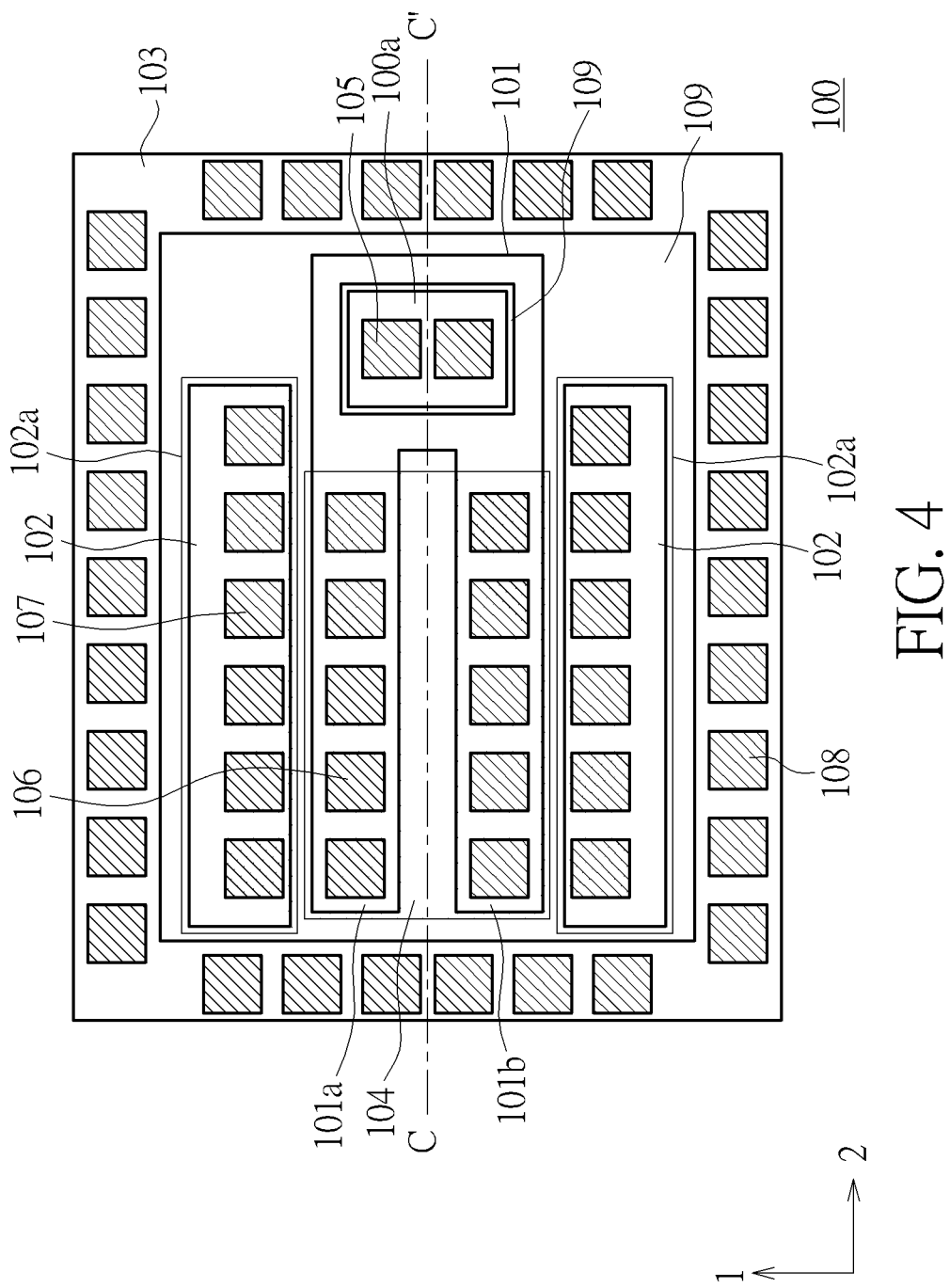
FIG. 4 is a schematic top view of a test key in accordance with one embodiment of the present invention.

Refer now to FIG. 4, is a schematic top view of a test key in accordance with one embodiment of the present invention. After the predetermined well regions the doped regions of different conductivity type are defined on the substrate, a plurality of test pads 105-108 are formed on the above-described portion, including the two branch portions 101a, 101b which the first well region 101 and the N+ doped region 104 overlap, the P-substrate 100a surrounded by the right portion of the first well region 101, the second doped region 102a, and the peripheral third well region 103. It is preferable to have the test pads 105-108 regularly arranged symmetric about the center line C-C' in order to facilitate the electrical failure analysis (EFA). Please note that, in real implementation, the test pads 105-108 may not be formed directly on the corresponding regions. They may be formed on other layer, for example, a topmost passivation layer right above their corresponding regions. The figures and embodiments disclose and show the relative positions between the well regions, the doped region, and the test pads in top view to help readers to better understand the present invention.

In addition, please note that the above-identified test key arrangement shown in FIG. 4 is a generic embodiment including all the essential components to perform the window check task as the present invention purposes. The test key shown in FIG. 4 may be modified and combined with each other to form a larger test key combination in matrix form for more specified and detailed window checking. The relevant modification and combination will be explicitly described in following embodiments.

Figure 5:
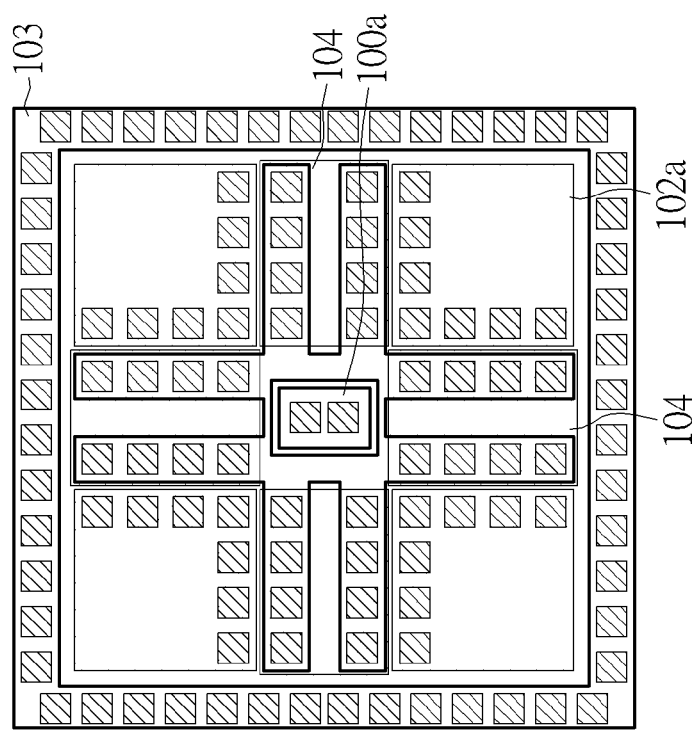
FIG. 5 is a schematic top view of a test key arrangement in the form of a matrix with 3×3 matrices in accordance with one embodiment of the present invention.

Please refer to FIG. 5. After explaining the generic test key arrangement in the present invention, a test key arrangement with combined test keys of FIG. 4 are provided in accordance with one embodiment of the present invention. The principle of combined test key arrangement in the present invention is to share some essential components in each test key and form a test key matrix with N×N matrices, so that a more detailed and scaled window check may be achieved without wasting the circuit area on the wafer and to fulfill the electrical failure analysis in advanced semiconductor technology generation applied thereto. FIG. 5 features a plurality of the first doped regions 104, the second doped region 102a and the substrate region 100a regularly arranged in a matrix with 3×3 matrices. It is clearly shown in the figure that all four N+ first doped regions 104 share a common portion 101c in center, and each two N+ doped region 104 shares a common P-type substrate region 100a. Similar to the embodiment of FIG. 4, the third well region 103 of second conductivity type (N-type) in this arrangement is defined surrounding the all NMOS AAs and PMOS AAs in the matrix.

Figure 6:
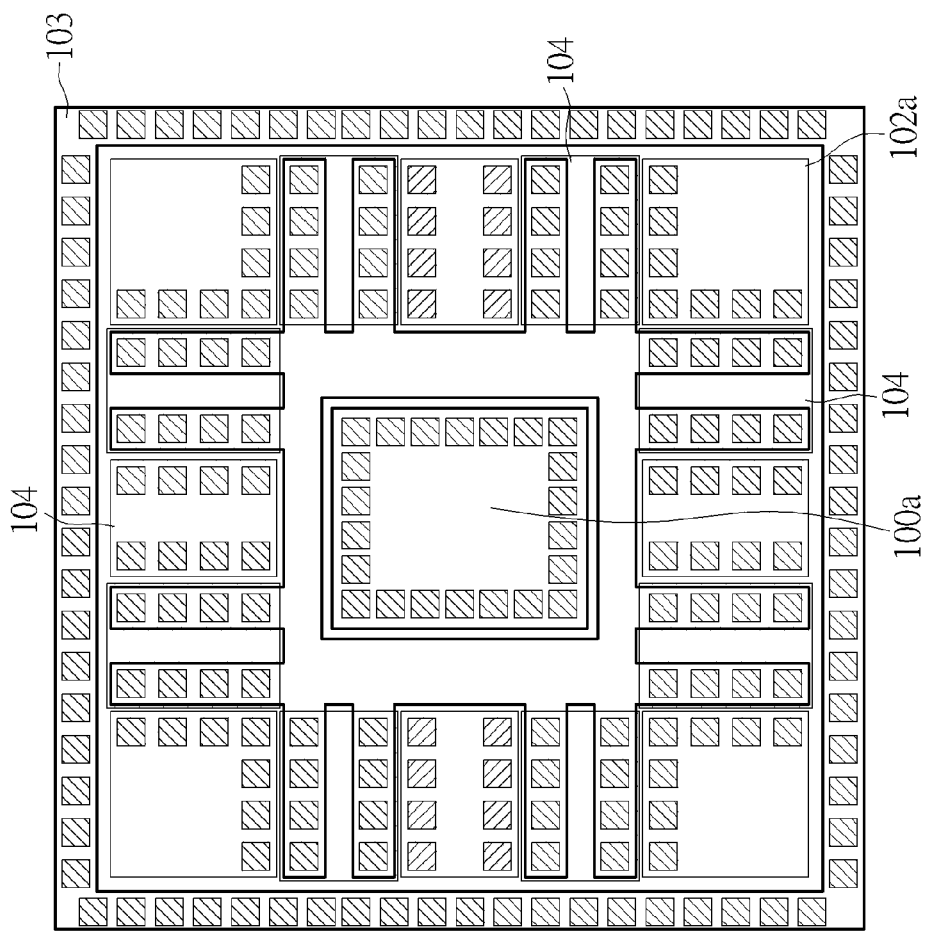
FIG. 6 is a schematic top view of a test key arrangement in the form of a matrix with 5×5 matrices in accordance with one embodiment of the present invention.

Please refer to FIG. 6, a test key matrix with more combined test keys units are provided in accordance with another embodiment of the present invention. FIG. 6 features a plurality of the first doped regions 104, the second doped region 102a and the substrate region 100a regularly arranged in a matrix with 5×5 matrices. It is clearly shown in the figure that all eight N+ first doped regions 104 share a big, common P-type substrate region 100a in center, and each two N+ first doped region 104 shares a common P+ second doped region 102a. Similar to the embodiment of FIG. 4, the third well region 103 of second conductivity type (N-type) in this arrangement is defined surrounding the all NMOS AAs and PMOS AAs in the matrix.

Figure 7:
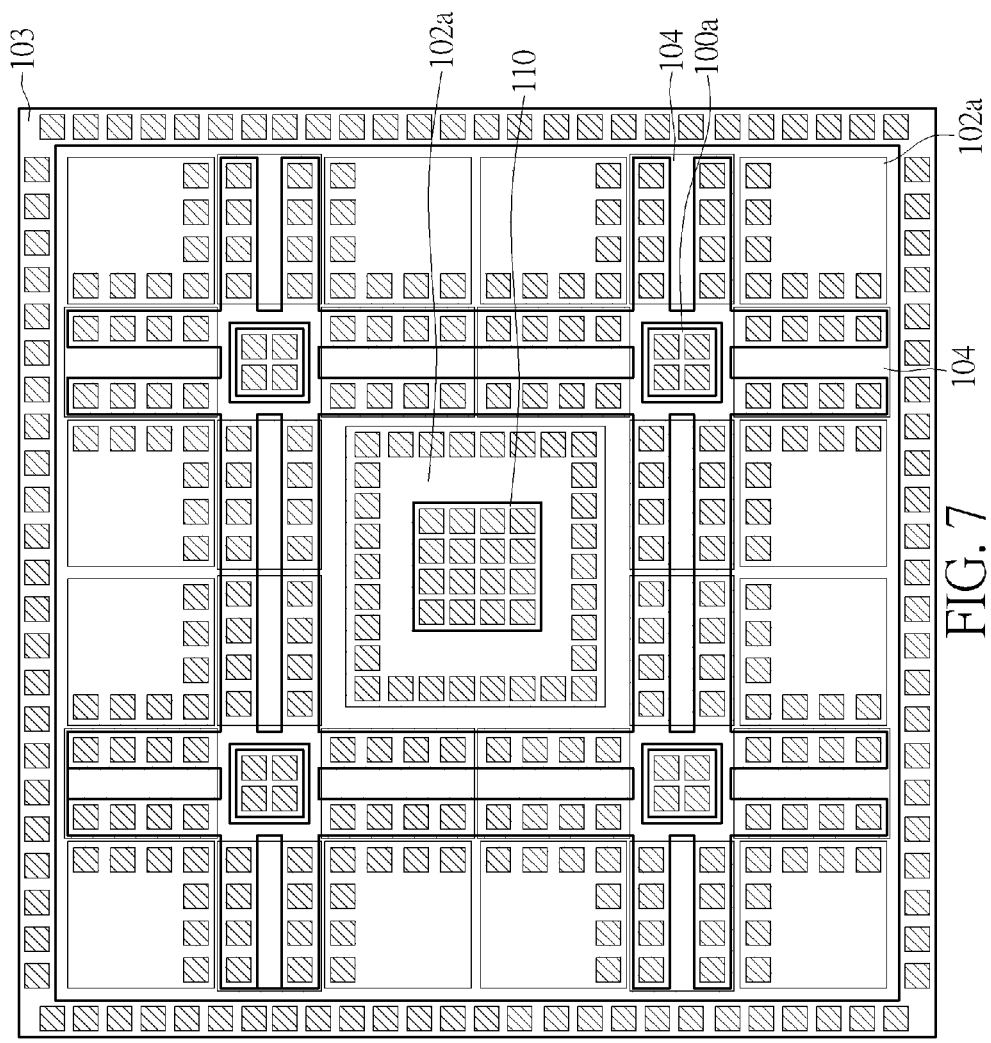
FIG. 7 is a schematic top view of a test key arrangement in the form of a matrix with 6×6 matrices in accordance with one embodiment of the present invention.

Please refer to FIG. 7, a test key matrix with even more combined test keys units are provided in accordance with still another embodiment of the present invention. FIG. 7 features a plurality of the first doped regions 104, the second doped region 102a and the substrate region 100a regularly arranged in a matrix with 6×6 matrices. Unlike the embodiments shown in FIG. 5 and FIG. 6, there are four common P-type substrate regions 100a shared by twelve N+ first doped regions 104 in the matrix, and an additional N-type third well region 110 is defined in the center to facilitate the EFA process. Similar to the embodiment of FIG. 4, the N-type third well region 103 in this arrangement is defined surrounding the all NMOS AAs and PMOS AAs in the matrix.

Figure 8:
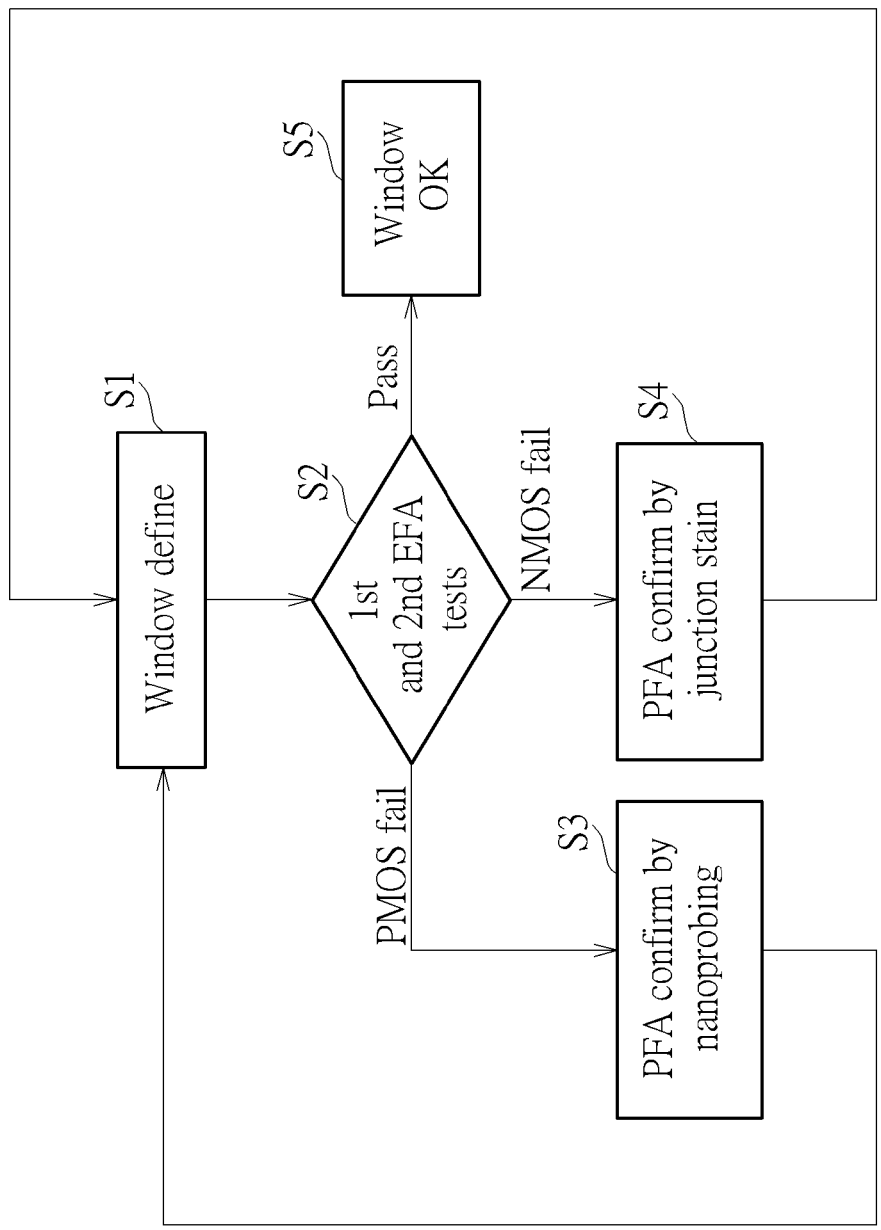
FIG. 8 is a flow chart of a method for checking the window of a doped region by using test keys in accordance with an alternative embodiment of the present invention.

After the varied test key arrangements as shown in FIGS. 4-6 are described in the embodiments, a method for checking the window of a doped region is herein provided to demonstrate how to use these test keys to detect and check the window of the partial implantation issue as identified in FIG. 1. Please refer to FIG. 8, which is a flow chart of a method for checking the window of a doped region by using test keys in accordance with one embodiment of the present invention. The method starts in the step S1 of defining the window for the electrical failure analysis (EFA). This step would determine the number of the test keys in the form of a matrix with N×N matrices according to the semiconductor technology generation (ex. 65 nm, 45 nm, 32 nm . . . etc) applied thereto, the dimension of the scribe line where the test key arrangement forms, or even to the customized arrangements for particular products.

After the window of EFA is defined, an EFA test (step S2) is performed to detect if any abnormal implantation issue occurs. The EFA test substantially includes a first EFA test for the first doped region 104 with second conductivity type (ex. NMOS AA) and a second EFA test for the second doped region 102a with first conductivity type (ex. PMOS AA). For the NMOS AA, the first EFA test is performed by electrically connecting the test pad 106 respectively on the N-type branch portion 101a, 101b of the first well region 101 overlapping the first doped region 104 with the test pad 105 on the P-type substrate region 100a as shown in FIG. 4, to detect if any abnormal junction leakage occurs. If there is any junction leakage detected, it represents there might be potential abnormal N+ implantation issues on the predetermined NMOS AA.

Similarly, for the PMOS AA, the second EFA test is performed by electrically connecting the test pad 107 on the P-type second doped region 102a and the test pad 108 on the N-type third well region 103 as shown in FIG. 4 to detect if any abnormal junction leakage occurs. If there is any junction leakage detected, it represents there might be potential abnormal P+ implantation issues on the predetermined PMOS AA.

Refer again to FIG. 6. Once there is junction leakage detected on the NMOS AA and the PMOS AA, a further physical failure analysis (PFA) will be performed on the corresponding failure AA to confirm if the failure issue is resulted from the abnormal P+ or N+ implantation. For PMOS failure, nanoprobing is used to confirm the abnormal P+ implantation issues (step S3). For NMOS AA failure, a transmission electron microscopy (TEM) cross-sectional image of the NMOS will check if any junction stain exists (step S4). The flow of the window checking for NMOS and PMOS is completed once both first EFA test and second EFA test pass (step S5).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A test key for checking the window of a doped region, comprising:
   a substrate;
   a first well region of first conductivity type on said substrate;

a substrate region of first conductivity type adjacent to said first well region;

a first doped region of second conductivity type partially overlapping said first well region;

two second doped regions of first conductivity type at two opposite sides of said first well region on said substrate;

a second well region of second conductivity type surrounding said first doped region, said substrate region and said two second doped regions; and a plurality of test pads above said first doped region overlapping said first well region, said substrate region, said two second doped regions and said second well region.

2. The test key for checking the window of a doped region of claim 1, further comprising a shallow trench isolation between said first well region, said two second doped regions and said second well region.

3. The test key for checking the window of a doped region of claim 1, wherein said first well region, said second doped region, said second well region and said plurality of test pads are symmetric about a center line of said first well region in a longitudinal direction.

4. The test key for checking the window of a doped region of claim 1, wherein the portion of said first well region overlapping said first doped region is divided into two symmetric portions by a shallow trench isolation.

5. The test key for checking the window of a doped region of claim 1, wherein a plurality of said test keys are arranged in a matrix with N×N matrices surrounding by said second well region of second conductivity type, wherein each said matrix is said first doped region, said second doped region and said substrate region.

6. The test key for checking the window of a doped region of claim 5, wherein a plurality of said test keys share one common said substrate region.

7. The test key for checking the window of a doped region of claim 5, wherein a plurality of said test keys share one common said second doped region.

* * * * *